United States Patent [19]

Kotani

[11] Patent Number: 5,111,404
[45] Date of Patent: May 5, 1992

[54] METHOD FOR MANAGING PRODUCTION LINE PROCESSES

[75] Inventor: Norihiko Kotani, Itami, Japan

[73] Assignee: Mitsubishi Denki Kabushiki Kaisha, Japan

[21] Appl. No.: 447,439

[22] Filed: Dec. 7, 1989

Related U.S. Application Data

[63] Continuation of Ser. No. 176,863, Apr. 1, 1988, Pat. No. 4,901,242.

[30] Foreign Application Priority Data

Apr. 3, 1987 [JP] Japan .................................. 62-83415

[51] Int. Cl.$^5$ ...................... G06F 15/46; G05B 13/04
[52] U.S. Cl. .................................. 364/468; 364/149; 364/578
[58] Field of Search ................ 364/468, 148, 149-151, 364/164, 165, 488-491, 552, 554, 578, 152-156, 400, 401, 402, 300, 200 MS File, 900 MS File; 437/7, 8, 51

[56] References Cited

U.S. PATENT DOCUMENTS

| | | | |
|---|---|---|---|
| 3,751,647 | 8/1973 | Maeder et al. | 364/150 |
| 3,922,642 | 11/1975 | Tooka | 364/200 |
| 4,038,531 | 7/1977 | Loe, Jr. | 364/150 |
| 4,571,685 | 2/1986 | Kamoshida | 364/468 |
| 4,719,586 | 1/1988 | Moyer et al. | 364/552 |
| 4,796,194 | 1/1989 | Atherton | 364/468 |

OTHER PUBLICATIONS

"Automated Semiconductor Wafer Processing", Microelectronics Manufacturing and Testing, Apr. 1983, pp. 46-47.

Primary Examiner—Joseph Ruggiero
Attorney, Agent, or Firm—Leydig, Voit & Mayer

[57] ABSTRACT

A system for managing successive processes which are to be performed on raw articles in a production line for producing finished articles. The system comprises a process managing block for receiving data on preceding processes which have already been performed on partially finished articles on the production line and delivers conditions for the processes which are to be subsequently performed on the production line, a data accumulation block for statistically accumulating data concerning preceding processes carried out on the production line, and a simulation block for determining optimum conditions for the processes which are to be subsequently performed based on the data concerning the preceding processes which have been actually performed on the production line and the statistical data accumulated on the data accumulation block. The simulation block provides optimum process conditions to the process managing block. Any deviation of the characteristics of the unfinished product caused by preceding processes are compensated for by appropriately varying the conditions of the subsequent processes whereby finished articles of high quality are produced with a high yield.

2 Claims, 2 Drawing Sheets

METHOD FOR MANAGING PRODUCTION LINE PROCESSES

This application is a continuation of application Ser. No. 07/176,863, filed Apr. 1, 1988, now U.S. Pat. No. 4,901,242.

BACKGROUND OF THE INVENTION

1. Field of the Invention

This invention relates to a system for managing production of semiconductor devices and, more particularly, to a system for managing conditions on a production line for producing semiconductor devices.

2. Description of the Related Art

FIG. 2 is a schematic block diagram of a conventional production line for producing semiconductor devices. The production line 1 has a plurality of production apparatus 11a disposed therealong and inspection apparatus 11b which are suitably arranged between adjacent production apparatus 11a. The production apparatus 11a effect various processes or treatments on successive semiconductor wafers. The processes and treatments include, for example, ion implantation, oxidation, diffusion, sputtering of Al or other materials, deposition of dielectric materials, etching and pattern exposure. The inspection apparatus 11b inspects partially finished products which have been prepared by the production apparatus which is immediately upstream thereof. For example, the inspection apparatus is intended for measurement of the sheet resistance, film thickness and so forth.

These production apparatus 11a and the inspection apparatus 11b operate in accordance with predetermined production conditions and inspection conditions which are set in the corresponding recipes 3.

In operation, each of the semiconductor wafers 2 introduced onto the production line 1 undergoes various processes or treatments which are performed by the production apparatus 11a in accordance with production conditions set in the recipes 3, as well as inspections performed by the inspection apparatus 11b in accordance with various inspection conditions set in the corresponding recipes 3. A desired semiconductor device is obtained when the semiconductor wafer 2 has passed through all the production apparatus 11a and the inspection apparatus 11b, and comes off the production line 1.

Then, the product undergoes an evaluation performed by an evaluation apparatus (not shown) which measures characteristics such as the threshold level, current driving capacity and so forth, thus evaluating the quality and performance of the product semiconductor device. The measurement and evaluation cannot be executed unless the production proceeds to the final process.

In general, however, errors in the prescribed accuracy in the production apparatus 11a and the inspection apparatus 11b often occur or they may fail to exactly perform the expected operations for some reason. It is to be noted that, in the conventional production line, the production apparatus and the inspection apparatus are allowed to operate independently, regardless of errors and malfunctions in the production apparatus 11a and the inspection apparatus 11b. This means that, even though an upstream production apparatus 11a has failed to execute an expected operation, the production apparatus 11a of the next stage, i.e., the downstream production apparatus 11a, is allowed to conduct ordinary operations in accordance with the conditions set in the recipe 3. This conventional production line, therefore, involves a large risk of the product semiconductor device being rejected due to unacceptably low quality or performance. In such a case, the operation of the downstream production apparatus 11a is useless. Further, although it is possible to reject any poor product during the production steps if it is detected by any one of the inspection apparatus, such rejection will seriously impair production yield.

SUMMARY OF THE INVENTION

Accordingly, an object of the present invention is to provide a system for managing the production of semiconductor devices which enables semiconductor devices of high quality to be produced stably and with a high yield, thereby overcoming the above-described problems of the prior art.

To this end, according to the present invention, there is provided a system for managing conditions of successive processes which are carried out on a semiconductor wafer in a production line for producing a semiconductor device, the system comprising: a process managing means for receiving data concerning the preceding processes which have already been carried out on the semiconductor wafer on the production line and for establishing conditions of the following processes which are to be subsequently carried out on the production line; a data accumulation means for statistically accumulating the data concerning the processes which are carried out on the production line; and a simulation means for determining optimum conditions for the following processes based on the data concerning the preceding processes which have been actually carried out on the production line and the statistical data accumulated by the data accumulation means and for delivering the optimum conditions to the process managing means.

Thus, according to the present invention, data concerning the processes actually conducted on the semiconductor wafer are recorded and the optimum conditions for the subsequent production processes or treatments are determined and set in the production line in accordance with the thus recorded contents and statistical data.

In general, the threshold level and the current driving capacity of a semiconductor wafer product, which are measured for evaluation purposes after the production thereof, fluctuate according to various factors which are involved in the various processes or treatments on the production line. It is also to be noted that many of these fluctuation factors can be compensated for by suitably varying the conditions of subsequent processes or treatments. For instance, the threshold level in a MOSFET is determined by various related factors such as the thickness of the gate oxide film, the quantity of ions implanted in the channel, the depth of the source-drain junction, and so forth.

Therefore, by recording data concerning the processes conducted by upstream processes and determining the conditions of subsequent processes based on the recorded data, it is possible to produce semiconductor devices of high quality with outstanding yields, through mutually complementing or compensating for any fluctuations in the respective processes performed by different production apparatus on the production line.

DESCRIPTION OF THE PREFERRED EMBODIMENTS

Preferred embodiments of the present invention will be described hereinunder with reference to the accompanying drawings.

Figure 1:
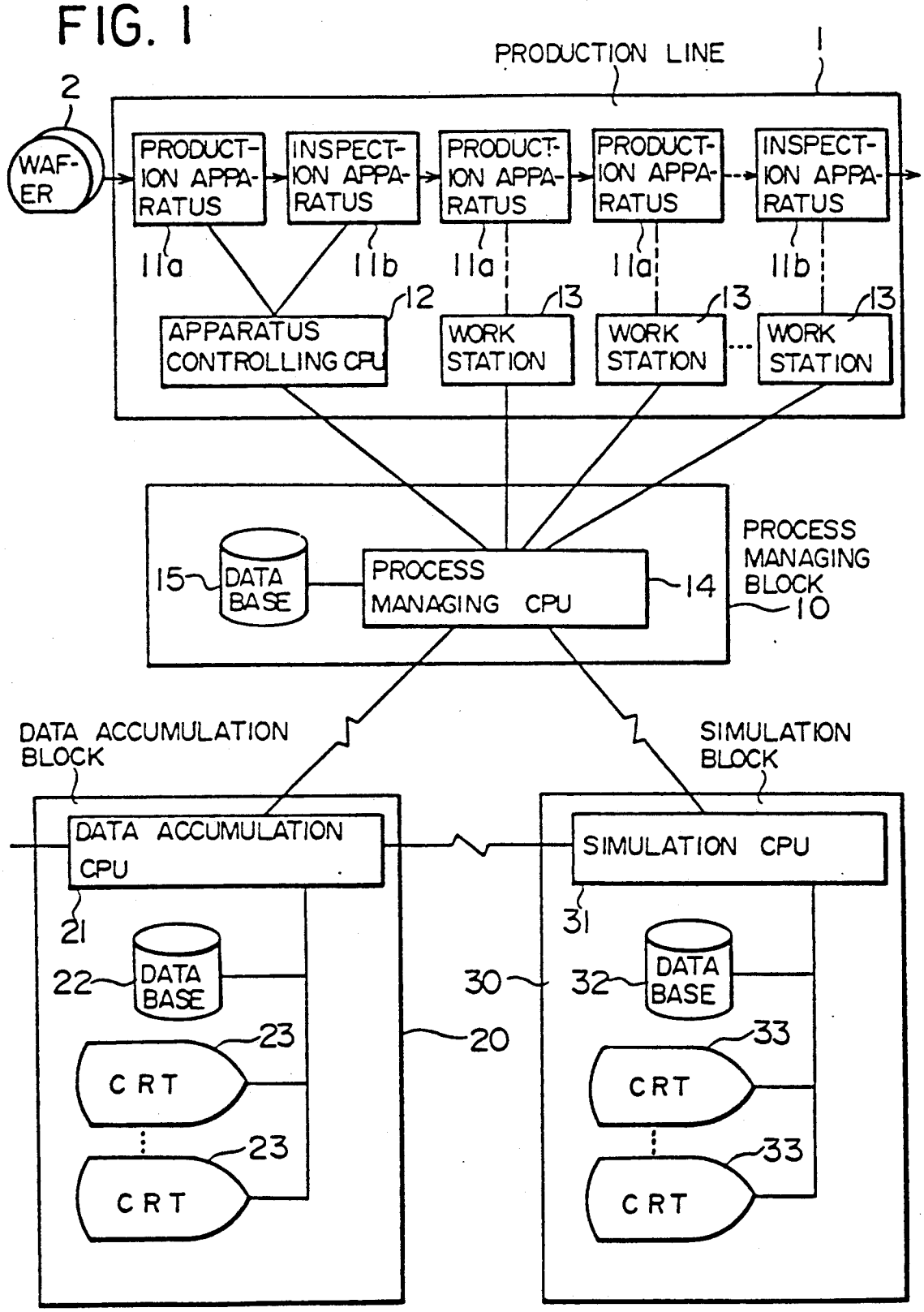
FIG. 1 is a block diagram showing an embodiment of the semiconductor device production managing system in accordance with the present invention.
Figure 2:
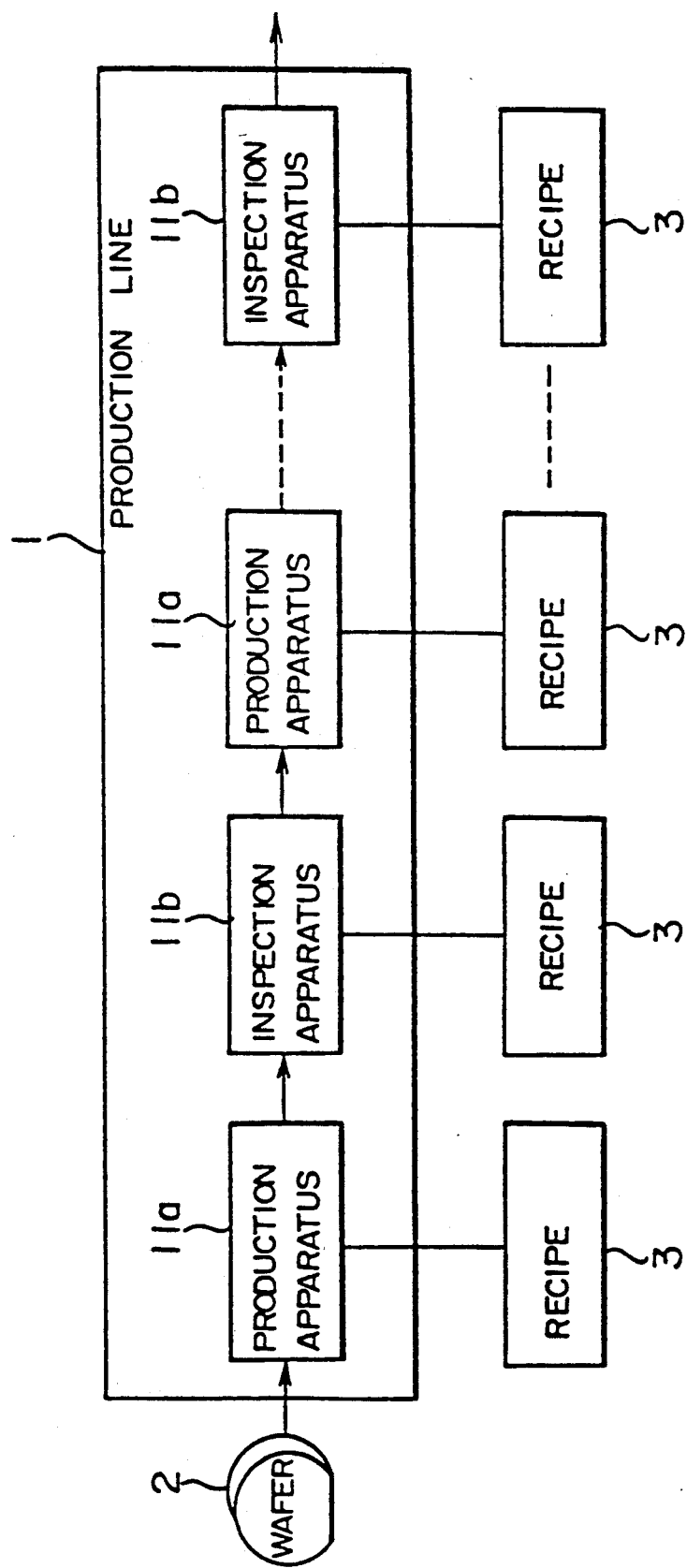
FIG. 2 is a block diagram of a conventional production line for producing semiconductor devices.

Referring to FIG. 1, a production line 1 for producing semiconductor devices has a plurality of production apparatus 11a, a plurality of inspection apparatus 11b suitably disposed between adjacent production apparatus 11a, and an apparatus controlling central processing unit (CPU) 12 which performs real-time on-line control of the production apparatus and inspection apparatus. The production line 1 may employ, in addition to or instead of the CPU 12, a work station 13 which enables an operator to manually control the operation of the production apparatus 11a and the inspection apparatus 11b.

The production apparatus 11a performs various processes or treatments on successive semiconductor wafers 2. The processes and treatments include, for example, ion implantation, oxidation, diffusion, sputtering of Al or other materials, deposition of dielectric materials, etching and pattern exposure. Each inspection apparatus 11b inspects the products which have been prepared by the production apparatus which is immediately upstream thereof. For example, the inspection apparatus measures sheet resistance, film thickness and so forth.

A production managing system having three blocks is connected to the production line 1.

More specifically, the production managing system has a first block 10, a second block 20 and a third block 30. The first block 10 is a process managing area or means which manages various processes or treatments effected by the production apparatus 11a, as well as various examinations or inspections performed by the inspection apparatus 11b. The process managing means 10 comprises a process managing CPU 14 connected to the CPU 12 and to the work stations 13, and a data base 15 connected to the process managing CPU 14. The data base 15 stores various flows or sequences of processes which are to be performed on the semiconductor device production line 1. The process managing CPU 14 gives instructions concerning process conditions to the apparatus controlling CPU 12 and the work station 13 on the production line, and collects data concerning the results of actually conducted processes, treatments or inspections. The system managing CPU 14 delivers the thus collected data to the data base 15.

The second block 20 is a data accumulation area or means which includes a data accumulation CPU 21 which is connected, through a communication line such as a local area network (LAN), to the process managing CPU 14 of the process managing means 10 to, a data base 22 and to a plurality of video terminals 23. The data accumulation means 20 accumulates and stores various data which have been acquired over a long time, such as the results of the processes or inspections conducted in the production line 1 and collected by the process managing means 10, data obtained through various tests conducted by an external evaluation system (not shown), e.g., wafer tests, final product tests, reliability tests, and so forth. The data accumulation means 20 also provides for reference to the accumulated data, as well as for statistical computations using these data.

The third block 30 is a simulation area or means which includes a simulation CPU 31 which is connected, through communication lines such as LANs, to the process managing CPU 14 of the process managing means 10, the data accumulation CPU 21 of the data accumulation means 20, a data base 32 and to a plurality CRT's 33. The simulation means 30 simulates the operation or characteristics of the semiconductor devices produced by the semiconductor production line 1 on the basis of the data stored in the data accumulation means 20. The simulation means 30 further determines optimum conditions for subsequent processes to be performed, and delivers the data for those optimum conditions to the process managing means 10. Many types of simulations are performed by the simulation means 30, such as a process simulation in which subsequent processes are simulated in accordance with the flow of the processes on the production line 1, a device simulation which predicts, on the basis of the result of the process simulation, the electric characteristics of a basic element of a semiconductor device such as a large scale integraled circuit (LSI), and a circuit simulation in which the operation of the semiconductor device is predicted on the basis of the results of the device simulation and information concerning the circuit arrangement. The simulation means 30 also performs various analytical operations such as structural analysis and heat analysis.

The simulation means 30 further has an artificial intelligence (AI), function which operates upon receipt of the results of various simulations and the statistical data determined by the data accumulating means 20.

Though the first to the third blocks 10, 20 and 30 are operable independently, quality performance is obtainable through linkage of the functions of these blocks.

The operation of this embodiment is as follows.

A program for carrying out the process flows which are previously stored in the data base 15 of the process managing means 10 is loaded into the apparatus controlling CPU 12 and the work station 13 of the production line 1 through the process managing CPU 14. Then, a recipe is input to each production and inspection apparatus 11a, 11b automatically by the apparatus controlling CPU 12 or manually through a work station 13. The production apparatus 11a or the inspection apparatus 11b performs a production or an inspection process on the semiconductor wafer 2 in accordance with the instructions given by the recipe. Data concerning the results of the production processes and inspections actually carried out by the production apparatus 11a and the inspection apparatus 11b are collected by the process managing CPU 14 through the apparatus controlling CPU 12 or the work station 13. The process managing CPU 14 then delivers these data to the data base 15. Thus, the data concerning the processes which are already finished are successively accumulated in the data base 15.

Then, some types of data, e.g., data concerning yield, are selected from among the data stored in the data base 15 and ar transferred to the data accumulation CPU 21 of the data accumulation means 20 through the process managing CPU 14 and the communication lines and are stored in the data base 22. The data base 22 also receives, on-line, and stores the results of various tests such as wafer tests, final product tests, reliability tests and the like performed by an external evaluation device (not shown) associated with the data accumulation means.

Various statistical computations and analyses are performed on the basis of these test results and the process data transmitted from the production line 1, so that the cause of any failure or malfunction in the production line 1 is clarified as desired, and changes in the operating characteristics of the production and inspection apparatus 11a and 11b during an extended period of use are determined. The results of such statistical and analytical computations are displayed on the CRT 23.

On the other hand, the data concerning the processes which have already been carried out, as well as a program for carrying out previously established process flows, are transferred to the simulation means 30 from the data base 15 of the process managing means 10 through the process managing CPU 14 and the communication line. Then, the simulation CPU 31 simulates the subsequent production processes for semiconductor devices by employing the actual data of the processes which have already been performed and the process flows for the following processes which are yet to be performed. In consequence, it is possible to predict, before all the remaining processes and treatments are completed, the operation and characteristics of the semiconductor devices which are to be obtained when all the processes and treatments are carried out according to the program. The result of the simulation is accumulated in the data base 32 and is displayed as desired on the CRT 33.

In the event that the characteristics of the simulated semiconductor device are not acceptable, the conditions of the processes and treatments which are to be subsequently carried out are varied in accordance with the statistical data computed by the data accumulation means 20, and the simulation is executed once again with the varied conditions, whereby the conditions of the processes which are to be subsequently performed are optimized for the production of the semiconductor devices having the desired operational characteristics.

The thus obtained optimum processing conditions are transferred from the simulation CPU 31 to the process managing CPU 14 of the process managing means 10 through the communication line. The process managing CPU 14 then extracts from the process flows stored in the data base 15 the processing conditions of the corresponding processes and inputs the optimum conditions transferred from the simulation block 30 so that they may be adopted instead of the earlier programmed process flow.

Thus, the optimum recipe is automatically set in the process managing means 10 and the production line 1 is controlled in accordance with the thus set recipe. It is therefore possible to produce semiconductor devices of high quality with a high yield.

In the described embodiment, the management of the data concerning the processing conditions carried out by the production line 1 is transferred in a centralized manner by the process managing CPU 14. This, however, is not exclusive and the arrangement may be such that the data management is shared with the apparatus control CPU 12 of the production line 1, as well as with the work station 13.

What is claimed is:

1. A method for managing processes that are successively carried out by a plurality of individual apparatus in a production line to produce operational finished articles from unfinished articles comprising:
    inputting a recipe to each of a plurality of individual production apparatus, each apparatus carrying out at least one process in a production line being supplied with unfinished articles at the beginning of the production line, producing partly finished articles in the production line and producing operational finished articles at the end of the production line;
    monitoring data concerning at least one of the processes which has already been carried out on partially finished articles in accordance with at least one recipe;
    simulating the operational characteristics of finished articles from the data concerning the partially finished articles and the recipes input to the production apparatus for producing finished articles from the partially finished articles;
    determining process conditions for the processes for production of finished articles from the partially finished articles in response to the simulation of operational characteristics to produce finished articles having desired operational characteristics; and
    controlling the conditions in response to the determined process conditions of at least one process to be carried out to produce, from partially finished articles, finished articles having the desired operational characteristics.

2. A method for managing processes that are successively carried out by a plurality of individual apparatus in a production line to produce operational finished articles from unfinished articles and a plurality of individual inspection apparatus for obtaining data concerning partially finished articles in the production line comprising:
    inputting a recipe to each of a plurality of individual production apparatus, each apparatus carrying out at least one process in a production line being supplied with unfinished articles at the beginning of the production line, producing partly finished articles in the production line and producing operational finished articles at the end of the production line;
    monitoring data concerning at least one of the processes which has already been carried out on partially finished articles in accordance with at least one recipe;
    collecting data concerning at least one inspection of partially finished articles processed in accordance with at least one of the recipes;
    simulating the operational characteristics of finished articles from the data concerning the partially finished articles and the recipes input to the production apparatus for producing finished articles from the partially finished articles;
    determining process conditions for the processes for production of finished articles from the partially finished articles in response to the simulation of operational characteristics of finished articles and the collected data in order to produce finished articles having desired operational characteristics; and
    controlling the conditions in response to the determined process conditions of at least one process to be carried out to produce, from partially finished articles, finished articles having the desired operational characteristics.

* * * * *